(12) United States Patent
Drost et al.

(10) Patent No.: US 8,531,042 B2
(45) Date of Patent: Sep. 10, 2013

(54) TECHNIQUE FOR FABRICATING MICROSPRINGS ON NON-PLANAR SURFACES

(75) Inventors: Robert J. Drost, Los Altos, CA (US); John E. Cunningham, San Diego, CA (US); Ashok V. Krishnamoorthy, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 979 days.

(21) Appl. No.: 12/495,057

(22) Filed: Jun. 30, 2009

(65) Prior Publication Data

US 2010/0327466 A1 Dec. 30, 2010

(51) Int. Cl.
*H01L 29/41* (2006.01)

(52) U.S. Cl.
USPC ........... 257/785; 257/773; 257/E23.078; 257/E21.499; 438/117; 438/620; 361/776; 174/261; 29/881; 29/882

(58) Field of Classification Search
USPC ........... 257/785, E23.078, E23.169, E21.499, 257/773; 438/117, 620; 174/261; 361/776; 29/874, 881, 882, 884
See application file for complete search history.

(56) References Cited

U.S. PATENT DOCUMENTS

| | | | | |
|---|---|---|---|---|
| 5,476,211 A * | 12/1995 | Khandros | ................... | 228/180.5 |
| 5,898,597 A * | 4/1999 | Scepanovic et al. | .......... | 716/123 |
| 6,110,823 A * | 8/2000 | Eldridge et al. | ............. | 438/660 |
| 6,184,587 B1 * | 2/2001 | Khandros et al. | ............. | 257/784 |
| 6,252,175 B1 * | 6/2001 | Khandros | ..................... | 174/250 |
| 6,330,164 B1 * | 12/2001 | Khandros et al. | ............. | 361/760 |
| 6,336,269 B1 * | 1/2002 | Eldridge et al. | ................ | 29/885 |
| 6,538,214 B2 * | 3/2003 | Khandros | ..................... | 174/267 |
| 6,727,579 B1 * | 4/2004 | Eldridge et al. | ............. | 257/692 |
| 6,777,145 B2 * | 8/2004 | Zhou et al. | ...................... | 430/30 |
| 6,778,406 B2 * | 8/2004 | Eldridge et al. | ............. | 361/776 |
| 6,835,898 B2 * | 12/2004 | Eldridge et al. | ............. | 174/267 |
| 6,887,723 B1 * | 5/2005 | Ondricek et al. | ............... | 438/14 |
| 6,973,637 B2 * | 12/2005 | Sharpe et al. | .................. | 430/311 |
| 7,142,000 B2 * | 11/2006 | Eldridge et al. | ......... | 324/750.05 |
| 7,217,580 B2 * | 5/2007 | Ondricek et al. | ............... | 438/14 |
| 7,225,538 B2 * | 6/2007 | Eldridge et al. | ................ | 29/879 |

(Continued)

OTHER PUBLICATIONS

Smith, Donald L. et al., "Flip-Chip Bonding on 6-um Pitch using Thin-Film Microspring Technology" Xerox Palo Alto Center, 48th Electrical Components and Technology Conference, 1998 IEEE.

(Continued)

*Primary Examiner* — Fernando L Toledo
*Assistant Examiner* — Victoria K Hall
(74) *Attorney, Agent, or Firm* — Park, Vaughn, Fleming & Dowler, LLP; Steven E. Stupp

(57) ABSTRACT

A processing technique facilitating the fabrication of the integrated circuit with microsprings at different vertical positions relative to a surface of a substrate is described. During the fabrication technique, microsprings are lithographically defined on surfaces of a first substrate and a second substrate. Then, a hole is created through a first substrate. Moreover, the integrated circuit may be created by rigidly mechanically coupling the two substrates to each other such that the microsprings on the surface of the second substrate are within a region defined at least in part by an edge around the hole. Subsequently, photoresist that constrains the microsprings on the surfaces of the two substrates may be removed. In this way, microsprings at the different vertical positions can be fabricated.

11 Claims, 12 Drawing Sheets

(56) References Cited

U.S. PATENT DOCUMENTS

| | | | |
|---|---|---|---|
| 7,518,247 B2* | 4/2009 | Sakamoto et al. | 257/773 |
| 7,700,218 B2* | 4/2010 | Sasahara et al. | 429/513 |
| 7,868,469 B2* | 1/2011 | Mizoguchi | 257/786 |
| 8,148,646 B2* | 4/2012 | Fan et al. | 174/261 |
| 2001/0002624 A1* | 6/2001 | Khandros et al. | 174/250 |
| 2001/0020743 A1* | 9/2001 | Eldridge et al. | 257/737 |
| 2005/0088633 A1* | 4/2005 | Borodovsky | 355/18 |
| 2007/0164428 A1* | 7/2007 | Elbanhawy et al. | 257/734 |
| 2008/0185180 A1* | 8/2008 | Cheng et al. | 174/266 |
| 2008/0296056 A1* | 12/2008 | Kinoshita et al. | 174/261 |
| 2009/0003979 A1* | 1/2009 | Stone et al. | 414/217.1 |
| 2010/0071948 A1* | 3/2010 | Wei | 174/261 |
| 2011/0203843 A1* | 8/2011 | Kushta | 174/377 |

OTHER PUBLICATIONS

Smith, Donald L. et al., "A New Flip-Pick Technology for High-Density Packaging" Xerox Palo Alto Research Center, 46th Electronic Components and Technology Conference, 1996 IEEE.

Bakir, Muhannad S. et al., "Sea of Leads Compliant I/O Interconnect Process Integration for the Ultimate Enabling of Chips With Low-k Interlayer Dielectrics", pp. 488-494, IEEE Transitions on Advanced Packaging, vol. 28, No. 3, Aug. 2005.

Kataoka, K. et al., "Multi-Layer Electroplated Micro-Spring Array for MEMS Probe Card", pp. 733-736, RCAST, The University of Tokyo.

Christiansen, Silke H. et al., "Wafer Direct Bonding: From Advanced Substrate Engineering to Future Applications in Micro/Nanoelectronics", pp. 2060-2106, Proceedings of the IEEE, vol. 94, No. 12, Dec. 2006.

Drost, Robert J. et al., "Proximity Communication", pp. 1529-1535, IEEE Journal of Solid-State Circuits, vol. 39, No. 9, Sep. 2004.

Mitchell, James G. et al., Patent Application entitled "Integrated-Circuit Package for Proximity Communication", U.S. Appl. No. 11/243,300, filed Oct. 3, 2005.

Bruel, M., "Silicon on Insulator Material Technology", Electronics Letters, Jul. 6, 1995, vol. 31, No. 14, pp. 1201-1202, IEEE.

* cited by examiner

TECHNIQUE FOR FABRICATING MICROSPRINGS ON NON-PLANAR SURFACES

BACKGROUND

1. Field

The present disclosure relates to techniques for fabricating microspring connectors. More specifically, the present disclosure relates to techniques for fabricating microsprings on non-planar surfaces.

2. Related Art

As integrated-circuit (IC) technology continues to scale to smaller critical dimensions, it is increasingly difficult for existing inter-chip connections to provide desired characteristics, such as: high bandwidth, low power, reliability and low cost. Several technologies have been proposed to address this problem, including: proximity communication or PxC (for example, with capacitive inter-chip contacts), inter-chip microsprings (with conductive inter-chip contacts), and a combination of PxC with microsprings (with capacitive inter-chip contacts). However, these proposed techniques often introduce additional packaging and reliability challenges.

PxC based on capacitive inter-chip contacts provides dense inter-chip connections, with a pitch between neighboring pads on the order of 10-100 µm. However, PxC typically requires a similar order of mechanical alignment. It can be difficult to maintain this alignment in the presence of vibrations and thermal stress using a low-cost chip package. Furthermore, the capacitance of the inter-chip contacts can be small, which makes it challenging to couple high-capacity power supplies using PxC.

Microsprings can be fabricated on a wide variety of surfaces, including: printed circuit boards (PCBs), organic or ceramic IC packages or on the surface of ICs themselves. They can be fabricated with an areal density of inter-chip connections that exceeds the density of input/output (I/O) signals on high performance ICs, and can provide electrical contacts without the use of solder. Moreover, microsprings can be designed to have more compliance than is possible by using PxC alone, which increases tolerance to mechanical movement and misalignment. Consequently, it may be useful to combine PxC with microsprings.

However, chips that communicate via PxC often include contacts on non-planar surfaces. While microsprings can be readily fabricated on a planar surface (such as the face of a silicon wafer) using existing integrated-circuit fabrication techniques, it can be difficult to fabricate microsprings on non-planar, multi-level surfaces.

Hence, what is needed is a low-cost and reliable technique for fabricating microsprings on non-planar surfaces.

SUMMARY

One embodiment of the present disclosure provides an integrated circuit that includes a first substrate that has a first surface with lithographically defined microsprings, and a second surface on an opposite side of the first substrate from the first surface. Moreover, the integrated circuit includes a second substrate that has a third surface, which includes lithographically defined microsprings, and which is rigidly mechanically coupled to the second surface of the first substrate. Note that the first surface is at a different vertical position than the third surface in the integrated circuit.

Furthermore, a difference in the vertical positions of the first surface and the third surface may be greater than a depth of focus in a lithographic process used to fabricate the microsprings on the first surface and the third surface. Consequently, a thickness of the first substrate may be greater than 5 µm.

In some embodiments, the first substrate is laminated to the second substrate. For example, the lamination may include: glue, solder, silicon-water fusion and/or copper-to-copper fusion. Moreover, the first substrate may include silicon or silicon-on-insulator, and the second substrate may include silicon or silicon-on-insulator.

Additionally, the first substrate may include a hole, defined at least in part by an edge, which extends from the first surface to the second surface, and the microsprings on the third surface may be within a region defined at least in part by the edge.

Another embodiment provides a computer system that includes the integrated circuit.

Another embodiment provides a method for fabricating the integrated circuit. During the method, microsprings are lithographically defined on the first surface of the first substrate. Then, the hole, defined at least in part by the edge, is created in the first substrate. This hole may extend from the first surface to the second surface of the first substrate, which is on the opposite side of the first substrate from the first surface. Next, microsprings are lithographically defined on the third surface of the second substrate. Furthermore, the integrated circuit is created by rigidly mechanically coupling the second surface of the first substrate to the third surface of the second substrate such that the microsprings on the third surface are within the region defined at least in part by the edge in the first substrate. Note that the first surface is at a different vertical position than the third surface in the resulting integrated circuit.

In some embodiments, after creating the integrated circuit, a photoresist layer on the first substrate, which mechanically constrains the microsprings on the first surface, is removed. Moreover, a photoresist layer on the second substrate, which mechanically constrains the microsprings on the third surface, may also be removed.

Note that rigidly mechanically coupling the first substrate to the second substrate may involve: gluing the first substrate to the second substrate, soldering the first substrate to the second substrate, fusing the first substrate to the second substrate using silicon-water fusion, and/or fusing the first substrate to the second substrate using copper-to-copper fusion.

Additionally, note that creating the hole may involve: epitaxial lift off etching along a cleavage plane of the first substrate, reactive ion etching of the first substrate, and/or grinding the first substrate.

Figure 1:
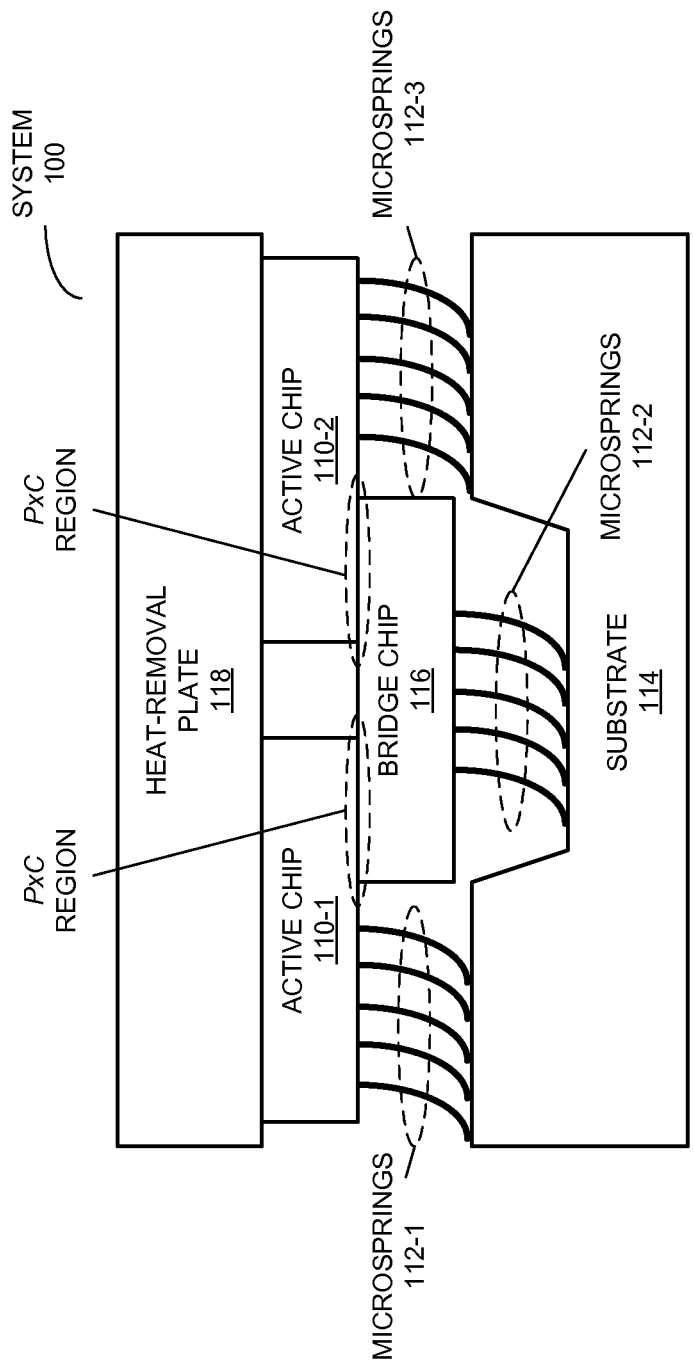
FIG. 1 is a block diagram illustrating a system that includes microsprings in accordance with an embodiment of the present disclosure.

Table 1 summarizes the effects of non-planarity during fabrication of an integrated circuit.

Note that like reference numerals refer to corresponding parts throughout the drawings. Moreover, multiple instances of the same part are designated by a common prefix separated from an instance number by a dash.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of an integrated circuit, a computer system that includes the integrated circuit, and a method for fabricating the integrated circuit are described. This processing technique facilitates the fabrication of the integrated circuit with microsprings at different vertical positions relative to a surface of a substrate. During the fabrication technique, microsprings are lithographically defined on surfaces of a first substrate and a second substrate. Then, a hole is created through the first substrate. Moreover, the integrated circuit may be created by rigidly mechanically coupling the two substrates to each other such that the microsprings on the surface of the second substrate are within a region defined at least in part by an edge around the hole. Subsequently, photoresist that constrains the microsprings on the surfaces of the two substrates may be removed.

By performing planarity-sensitive processing on planar surfaces of the substrates, this processing technique facilitates fabrication of microsprings at the different vertical positions (i.e., on non-planar surfaces). Moreover, the processing technique is reliable and low cost. Consequently, the processing technique may enable the use of proximity communication (PxC) with microsprings.

We now describe embodiments of a processing technique for fabricating an integrated circuit. FIG. 1 presents a block diagram illustrating a system 100 that includes microsprings 112 at different vertical positions in a package (which are sometimes referred to as multi-elevations within the package). In system 100, active chips 110 (which each may include circuits deposited on a substrate, such as a semiconductor die) communicate high-speed data using PxC. Additionally, active chips 110 receive power via microsprings 112 on substrate 114, which are electrically coupled with pads or connectors on a front face of active chips 110 and a back side of bridge chip 116. Note that power may be conducted from the back side to a front face of bridge chip 116 using through-hole vias (not shown). Moreover, a heat-removal plate 118 cools active chips 110 and bridge chip 116.

Figure 2:
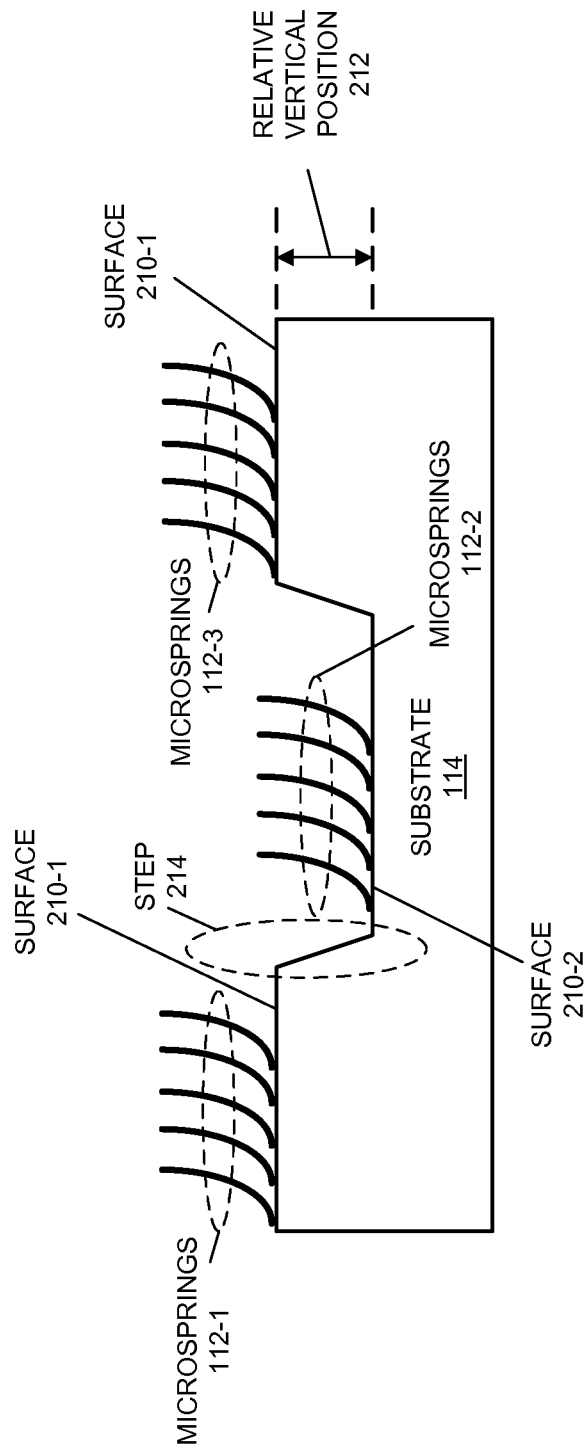
FIG. 2 is a block diagram illustrating a substrate that includes microsprings in accordance with an embodiment of the present disclosure.

FIG. 2 presents a block diagram illustrating substrate 114 that includes microsprings 112. Note that the relative vertical position 212 of surfaces 210 typically ranges from 40 to 400 µm.

As noted previously, it can be difficult to fabricate microsprings at different vertical positions using microfabrication techniques. In particular, multiple surface elevations can make it difficult to: deposit uniform metal and oxide layers, spin photoresist and/or to pattern optical images. However, in order to obtain dense, accurate and low-cost microsprings 112, these fabrication operations typically need to be accurate, reliable and inexpensive.

One possible solution to this fabrication problem is to reduce the thickness of bridge chip 116 (FIG. 1). For example, bridge chip 116 (FIG. 1) may be thinned, which may allow the relative vertical position 212 to be reduced. However, the resulting bridge chip may be fragile. Nonetheless, even if bridge chip 116 (FIG. 1) has a minimal thickness of 50 µm, it may still be difficult to fabricate microsprings 112 on the non-planar surfaces of substrate 114.

In the discussion that follows, a processing technique is described that facilitates fabrication of microsprings on non-planar surfaces. This processing technique may use only planar surfaces when layers are deposited and/or when patterns are optically defined. In particular, during the processing technique one or more planar-surface layers (which include the microsprings) are fabricated, as well as through-layer vias and the associated pads or electrical connections. Next, one or more of these planar-surface layers are lithographically etched (or otherwise cut) so that they have one or more holes. Moreover, the planar-surface layers are bonded together in order to form a multi-elevation surface (i.e., a non-planar surface) in which microsprings at lower elevations are accessible through the hole(s) in the upper surface layers. Note that the bonding process may include a conductive welding operation that electrically connects overlapping metal pads so that microsprings on an upper surface layer are conductively coupled to pads or microsprings on the opposing wafer face in the final multi-elevation surface substrate. Subsequently, a photoresist layer (which has already been optically exposed) may be etched, thereby releasing the microsprings. Additional operations, such as etching, plating and annealing, may be performed after wafer bonding because these operations are typically less sensitive to surface non-planarity.

Table 1 summarizes the effects of non-planarity during fabrication of an integrated circuit. In order to fabricate microsprings 112, the fabrication flow typically involves patterning a thin, uniform-thickness layer of stressed metal on a chip. Several problems occur when this is performed on a multi-elevation surface. First, in order to deposit a uniform layer, the surface beneath it typically needs to be smooth. However, if a bottom surface 210-2 in a multi-elevation surface is fabricated using a limited-depth etch into a top surface 210-1 in the multi-elevation surface, then this bottom surface typically will not be smooth. Alternatively, if top surface 210-1 is constructed by depositing oxide on bottom surface 210-2, then it will be challenging to polish top surface 210-1 using chemical-mechanical polishing (CMP) because the polishing will typically produce a non-uniform thickness near an elevation step, such as step 214.

TABLE 1

| Fabrication technique | Sensitive to planarity | Effect(s) of non-planarity |
|---|---|---|
| Ionization deposition | Yes | Thin, non-uniform deposition on walls of deep wells |
| Sputter deposition | Yes | Non-uniform layer thickness on walls of deep wells |
| Spin deposition | Yes | Beads and valleys form |
| Growth deposition | No | — |
| Optical patterning | Yes | Depth of focus is on the order of 1 μm |
| CMP | Yes | Non-uniform and unpredictable results near a step |
| Anisotropic etch | No | — |
| Isotropic etch | No | — |

Moreover, it may be challenging to pattern a thin metal layer. Planar microfabrication typically includes a series of operations in which a layer (such as metal, oxide, semiconductor, etc.) is deposited on a surface, and then is covered by a photoresist layer. While a metal layer can be deposited on a non-planar surface, the photoresist is typically spun on. Photoresist that is spun onto a non-planar surface often includes beads and valleys (i.e., forms thick and shallow areas) near an elevation step, such as step 214.

Furthermore, it may be difficult to pattern the photoresist with a desired pattern (that is associated with microsprings 112) on a non-planar surface. Patterned light exposes the photoresist, making regions of the photoresist susceptible to a certain etchant. This etchant then removes both these photoresist regions and the underlying undesired regions in a metal layer. However, optical systems that focus micron-resolution patterns typically have a limited depth of focus (which is on the order of 1 μm). As a consequence, it is often difficult to optically image the precise patterns associated with microsprings 112 at two very different surface elevations.

By bonding or attaching surfaces together after patterning and building the base microspring structure, the processing technique described below performs all of the planarity-sensitive operations on planar surfaces prior to constructing the multi-elevation surface. Furthermore, the multi-elevation surface in this disclosure permits through-substrate vias to couple each elevation of microsprings to the opposite side of the substrate (typically, it is difficult to fabricate vias at two different depths in a single substrate).

Figure 3:
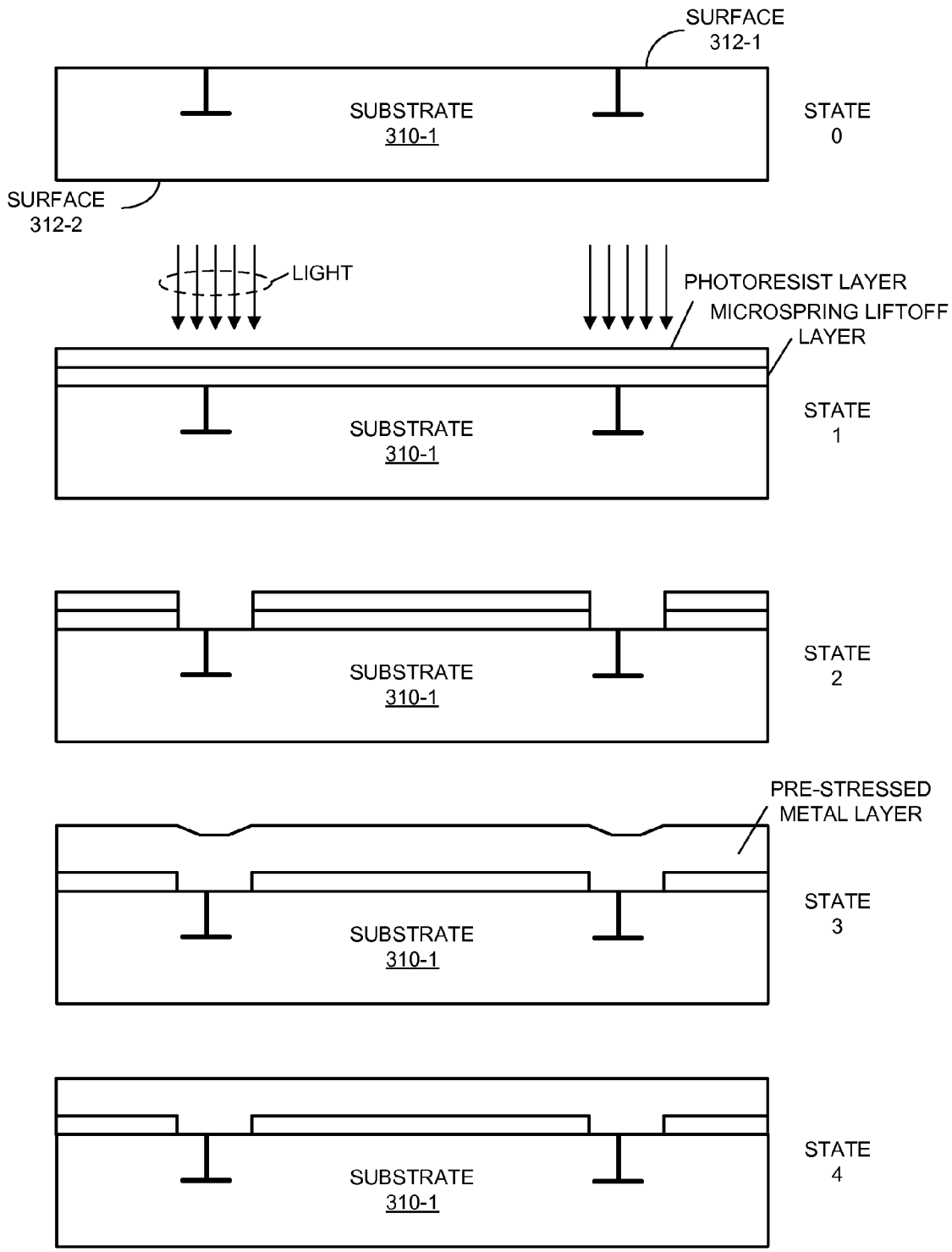
FIG. 3 is a block diagram illustrating states during fabrication of microsprings on a substrate in accordance with an embodiment of the present disclosure.

FIG. 3 presents a block diagram illustrating states during fabrication of microsprings on a substrate 310-1, which has surfaces 312. Before any processing takes place, substrate 310-1 is in state 0. Note that substrate 310-1 may have internal wiring, as illustrated in FIG. 3 by the upside-down T-shaped anchors. These anchors are wires that couple the surface of the wafer to various input/output (I/O), logic and power circuits. Note that lower metal layers or circuits are not shown in FIG. 3.

In state 1, a microspring liftoff layer and photoresist have been spun on top of substrate 310-1. Additionally, a patterned light source is exposing a portion of the photoresist. Moreover, in state 2 an etchant has removed the photoresist and the underlying microspring liftoff layer in the region exposed by the light pattern.

Then, in state 3, the remaining photoresist has been removed and a pre-stressed metal layer has been deposited over substrate 310-1. Note that the underlying topography of the patterned oxide transfers to some degree to the top surface of the pre-stressed metal layer.

In state 4, the pre-stressed metal layer has been polished so that it presents a planar top surface. Note that this polishing and the resultant planarization is absent in many process flows for fabricating microsprings because additional layers are often not fabricated over the microsprings.

Figure 4:
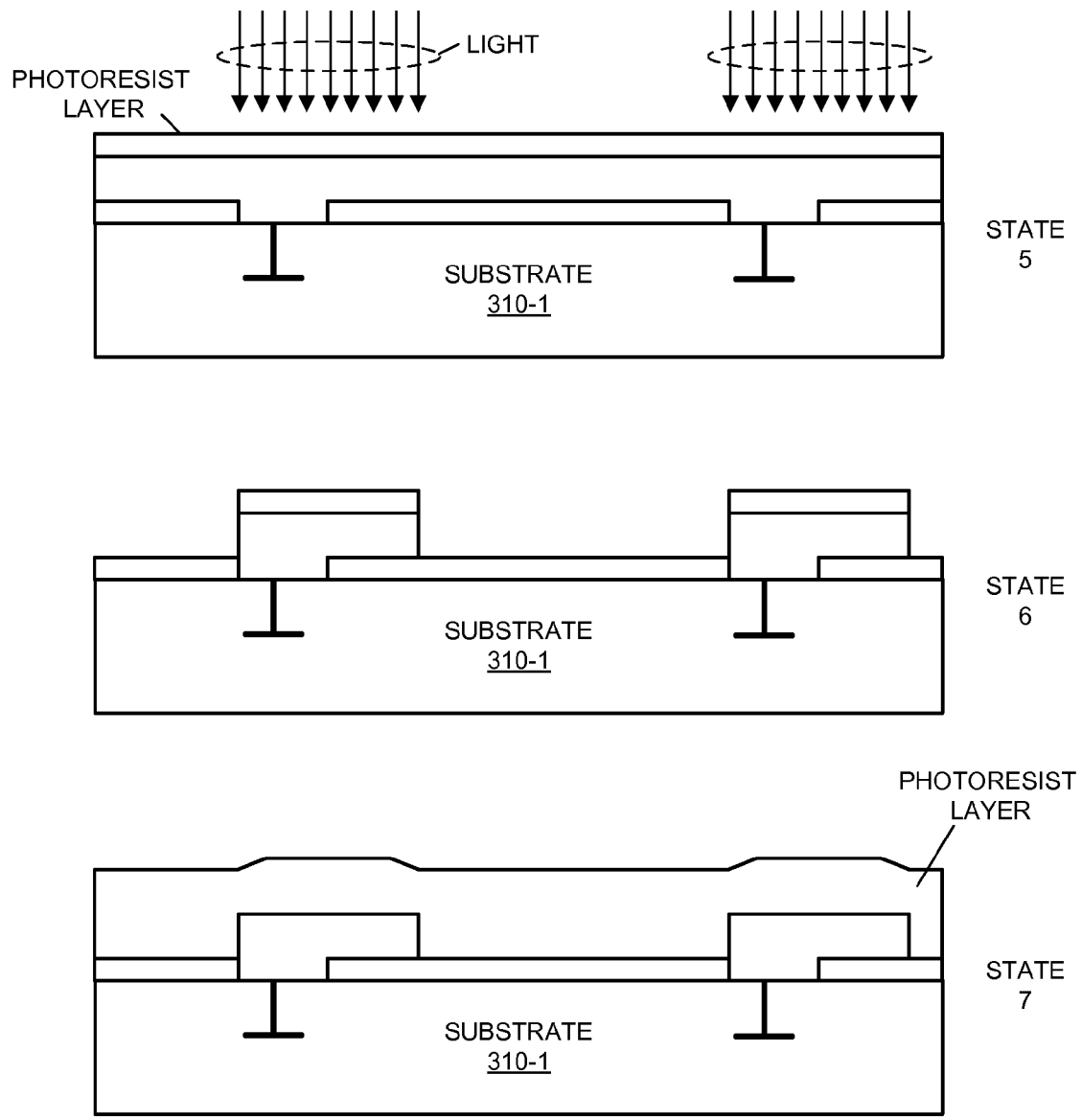
FIG. 4 is a block diagram illustrating states during fabrication of microsprings on the substrate of FIG. 3 in accordance with an embodiment of the present disclosure.

FIG. 4 presents a block diagram illustrating states during fabrication of microsprings on substrate 310-1. Note that the states shown in FIG. 4 occur after those shown in FIG. 3. In particular, in state 5 photoresist has been spun on top of the pre-stressed metal layer. Additionally a patterned light source is exposing a portion of the photoresist.

Then, in state 6 the photoresist and underlying pre-stressed metal layer have been removed outside the portions of the photoresist exposed by the light pattern. Furthermore, in state 7, the remaining photoresist has been etched away and a new photoresist has been spun over the entire top surface of substrate 310-1.

Figure 5A:
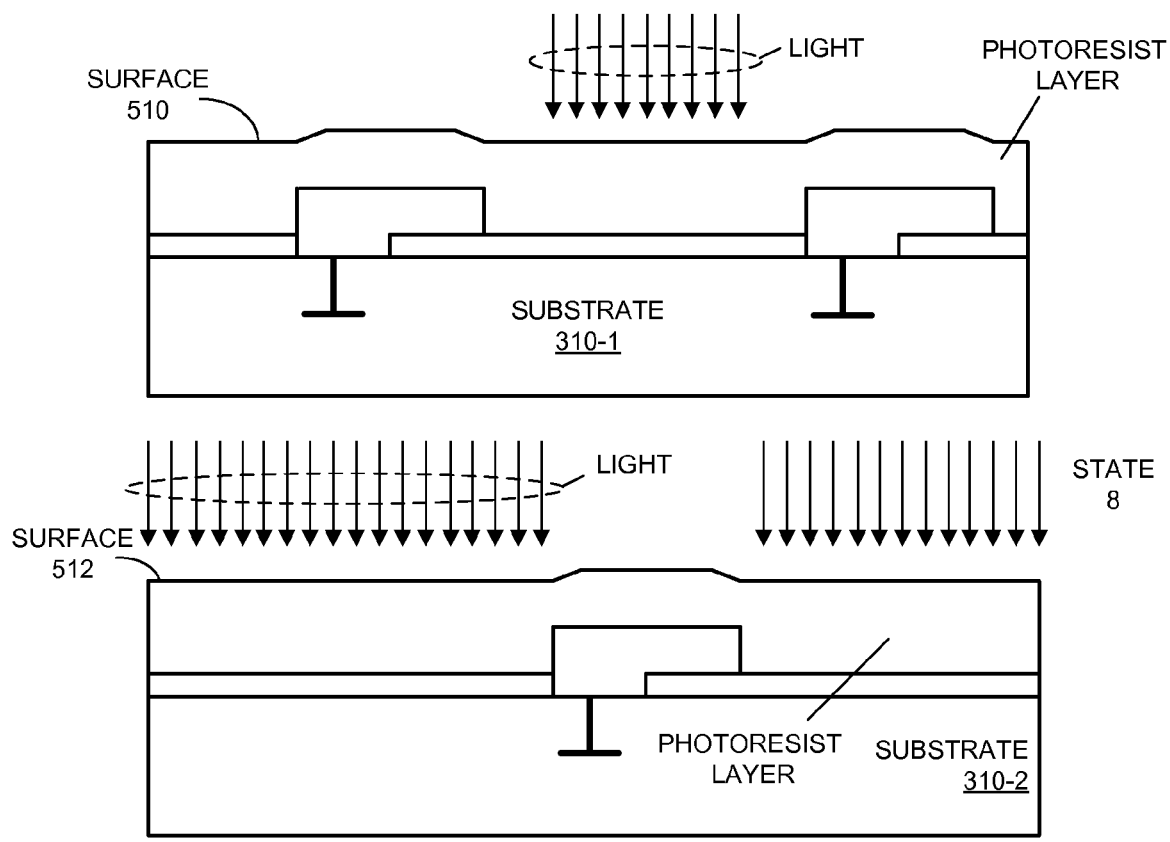
FIG. 5A is a block diagram illustrating states during fabrication of microsprings on two substrates in accordance with an embodiment of the present disclosure.
Figure 5B:
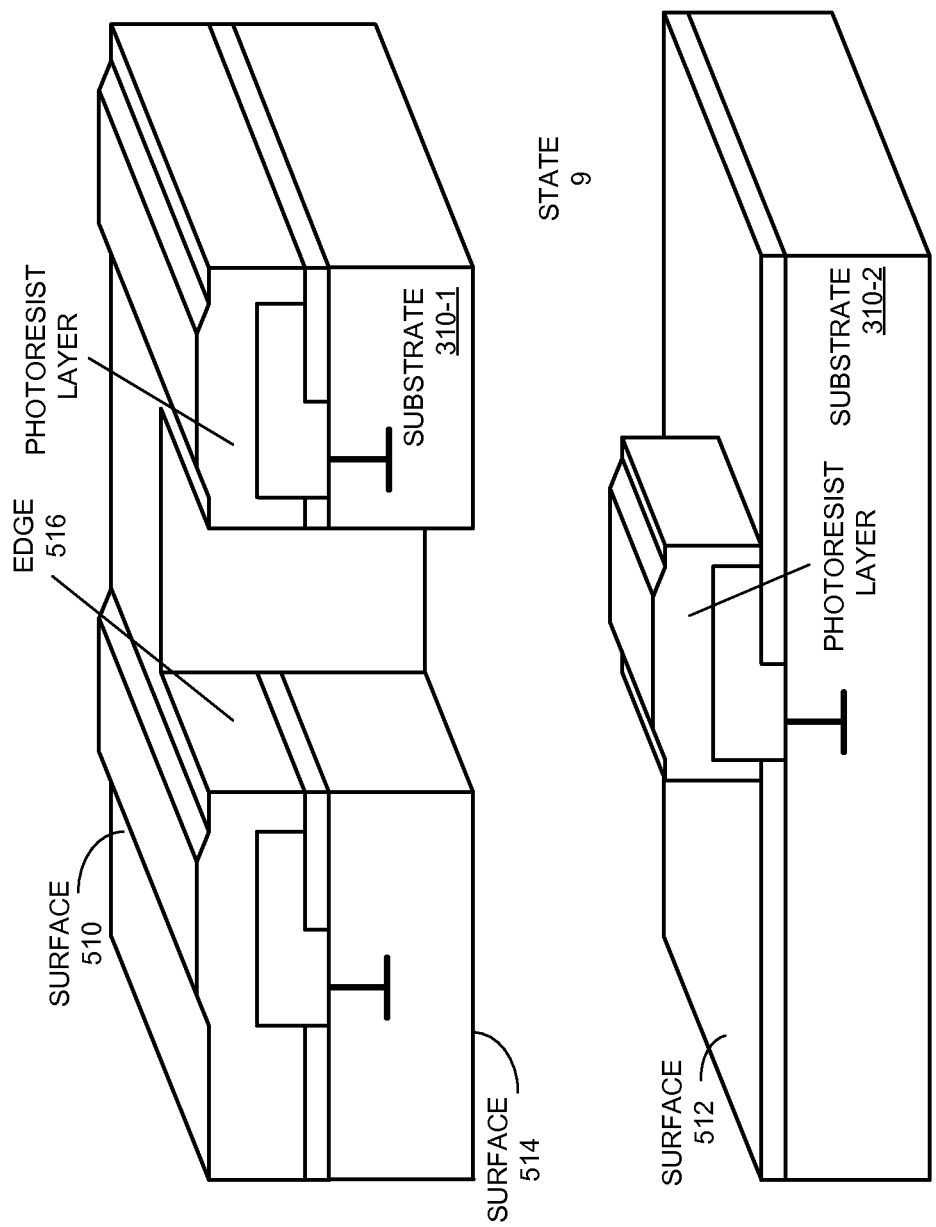
FIG. 5B is a block diagram illustrating states during fabrication of microsprings on the two substrates of FIG. 5A in accordance with an embodiment of the present disclosure.

FIGS. 5A and 5B present block diagrams illustrating states during fabrication of microsprings on substrates 310-1 and 310-2 (which are two instances of substrate 310-1 in FIG. 4). Note that the states in FIGS. 5A and 5B occur after those shown in FIG. 4.

FIGS. 5A and 5B show the top and bottom surface elevations in the soon-to-be-combined multi-elevation substrate. They also illustrate the processing operations that prepare substrates 310 for bonding. In state 8, photoresist on top surface 510 is exposed to the light pattern in a region corresponding to the microsprings on top surface 512. Also in state 8, photoresist on top surface 512 is exposed to patterned light in a region roughly opposite to the region exposed to the light pattern on top surface 510.

In state 9, top surface 510 has been etched through the entire substrate 310-1 (which may be 50-600 μm thick), creating a hole (which is, at least in part, defined by an edge 516). In some embodiments, creating the hole involves: epitaxial lift off, etching along a cleavage plane of substrate 310-1, reactive ion etching of substrate 310-1, and/or grinding substrate 310-1. Furthermore, the photoresist and oxide from operation 1 on the bottom substrate 310-2 have been removed in the region exposed to the light pattern. In addition, note that a bottom surface 514 of top substrate 310-1 and top surface 512 of bottom substrate 310-2 have been prepared for bonding. For example, dangling bonds may have been created on surfaces 512 and 514 so that they will form a contact bond if they are pressed together. If substrates 310 are silicon wafers, the substrate integration may be: wafer-to-wafer, die-to-wafer and/or die-to-die. In particular, if substrates 310 are silicon wafers, then wafer-fusion bonding may be used. In some embodiments, if optional through-substrate vias include copper, then copper-to-copper fusion may be used. Moreover, in some embodiments glue and/or solder is used to bond substrates 310 to each other.

Figure 6A:
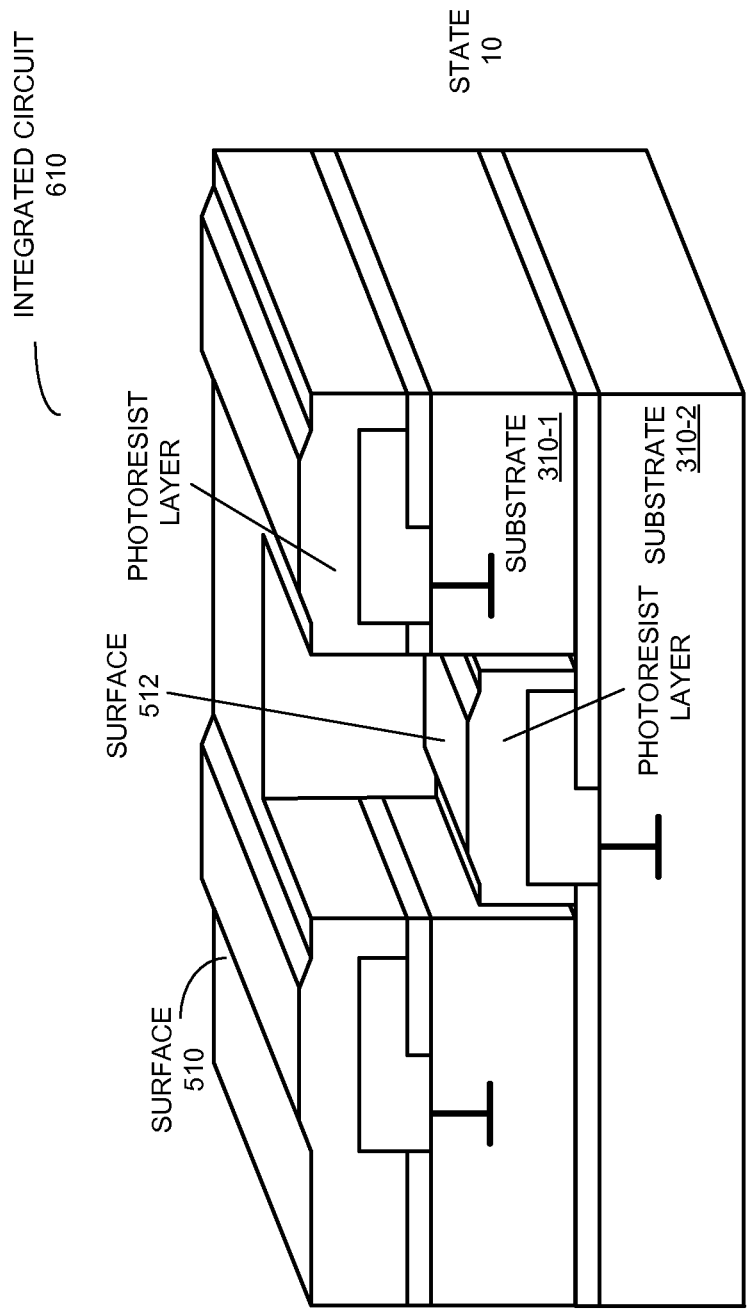
FIG. 6A is a block diagram illustrating states during fabrication of an integrated circuit that includes microsprings in accordance with an embodiment of the present disclosure.
Figure 6B:
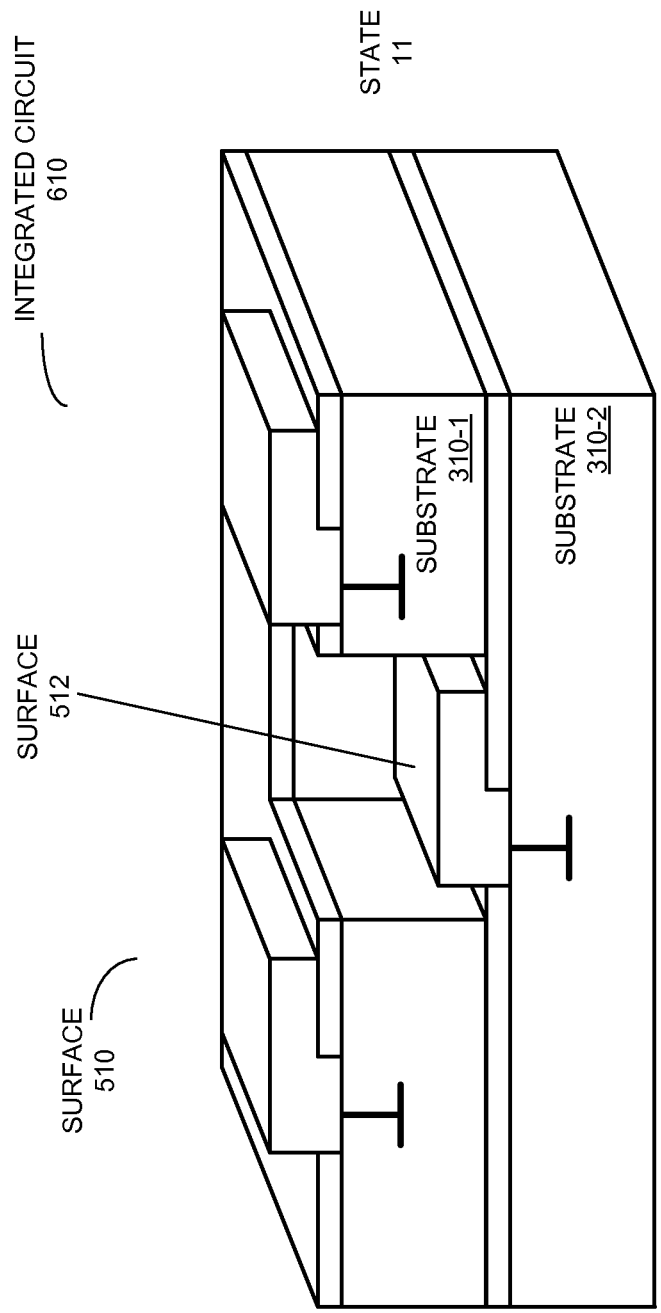
FIG. 6B is a block diagram illustrating states during fabrication of the integrated circuit of FIG. 6A in accordance with an embodiment of the present disclosure.
Figure 6C:
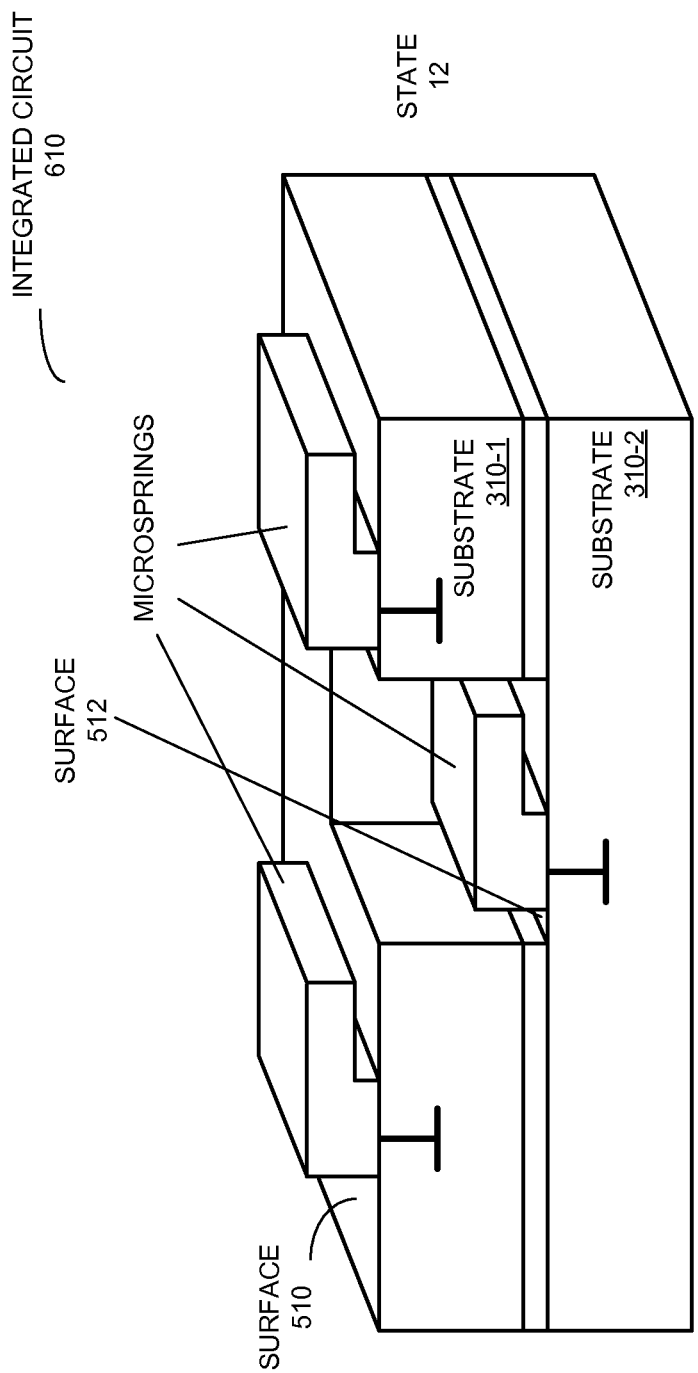
FIG. 6C is a block diagram illustrating states during fabrication of the integrated circuit of FIG. 6B in accordance with an embodiment of the present disclosure.

FIGS. 6A-6C present block diagrams illustrating states during fabrication of an integrated circuit 610 that includes multi-elevation microsprings. Note that the states in FIGS. 6A-6C occur after those shown in FIG. 5B. Furthermore, in accordance with the goals of the disclosure, operations during fabrication of the states in FIGS. 6A-6C may be tolerant of non-planar surface geometries.

In state 10, top substrate 310-1 and bottom substrate 310-2 have been bonded together to create a multi-elevation or laminated substrate. Moreover, in state 11 the photoresist has been etched. Note that although this occurred on the multi-elevation substrate, etch processing is typically tolerant of non-planar topographies.

In state 12, the oxide underneath the pre-stressed microsprings is removed, thereby releasing the microsprings (which may then point up and away from surfaces 510 and 512). Once again, this etching operation typically tolerates multiple elevations in the substrate surface.

Figure 7:
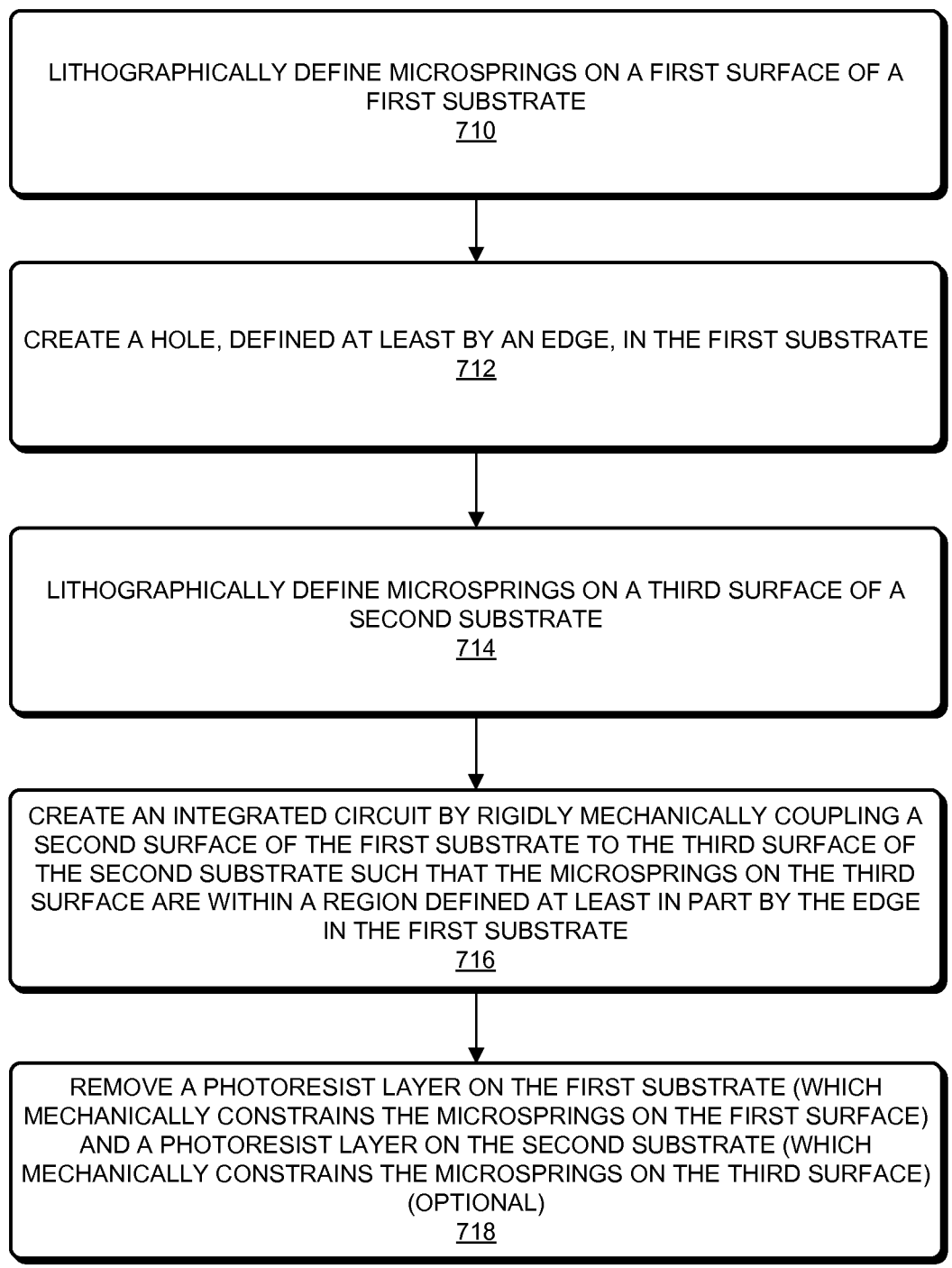
FIG. 7 is a flow chart illustrating a process for fabricating the integrated circuit of FIGS. 6A-6C in accordance with an embodiment of the present disclosure.

We now describe an embodiment of a process for fabricating an integrated circuit. FIG. 7 presents a flow chart illustrating a process 700 for fabricating integrated circuit 610 (FIGS. 6A-6C). During the method, microsprings are lithographically defined on the first surface of the first substrate (operation 710). Then, the hole, defined at least in part by the edge, is created in the first substrate (operation 712). This hole may extend from the first surface to the second surface of the first substrate, which is on the opposite side of the first substrate from the first surface. Next, microsprings are lithographically defined on the third surface of the second substrate (operation 714). Furthermore, the integrated circuit is created by rigidly mechanically coupling the second surface of the first substrate to the third surface of the second substrate such that the microsprings on the third surface are within the region defined at least in part by the edge in the first substrate (operation 716). Note that the first surface is at a different vertical position than the third surface in the resulting integrated circuit.

In some embodiments, after creating the integrated circuit in operations 710-716, a photoresist layer on the first substrate, which mechanically constrains the microsprings on the first surface, and a photoresist layer on the second substrate, which mechanically constrains the microsprings on the third surface, are optionally removed (operation 718).

In some embodiments of process 700 there may be additional or fewer operations. Moreover, the order of the operations may be changed and/or two or more operations may be combined into a single operation.

We now describe alternate embodiments for fabricating an integrated circuit that has microsprings at different vertical positions relative to a substrate. FIGS. 3-6C describe an exemplary sequence of operations to fabricate the microsprings. However, a different sequence of operations may be used. Furthermore, an entirely different set of structures may be fabricated. Although this disclosure describes a particular processing technique for fabricating the microsprings, this disclosure more generally allows an arbitrary structure, which is fabricated using planarity-sensitivity processing operations, to be combined into a non-planar multi-elevation substrate. This processing technique may be effective so long as, after joining the individual planar surfaces, subsequent fabrication operations are tolerant of non-planar surface topographies.

Although FIGS. 5A and 5B, and FIGS. 6A-6C illustrate a two-elevation substrate, this processing technique may be used to create more elevations by repeating the operations in FIGS. 3 and 4 for additional planar substrates, and etching holes and bonding these substrates together, as needed, to create the desired multi-elevation substrate.

Furthermore, in some embodiments through-substrate vias are included in the processing technique while only using planar processing for a subset of the operations in the processing technique. This can be achieved by fabricating through-substrate vias on both the individual planar substrates prior to bonding them together using standard planar processing. Then, during the bonding process, the through-substrate vias can be bonded to make a conductive connection through the multi-elevation substrate.

Microsprings may be fabricated on both the front and back faces of the multi-elevation substrate. First, the top substrate and the bottom substrates may undergo the fabrication operations illustrated in states 1 through 7 in FIGS. 3 and 4 on one surface and then be flipped over and processed on the back side. Next, the through-substrate etching and bonding shown in FIGS. 5A and 5B may be augmented to also etch holes in bottom substrate 310-2 that reveal microsprings on bottom surface 514 of top substrate 310-1 after bonding. Essentially, this would make the final multi-elevation substrate have etched holes in top-planar substrate 310-1 that reveal microsprings on bottom-planar substrate 310-2, as well as etched holes in bottom-planar substrate 310-2 that reveal microsprings on top-planar substrate 310-1.

Alignment between substrates 310 (FIGS. 6A-6C) may be accomplished in a variety of ways. Adhesive preparation of the substrates before mating, followed by pick-and-place alignment of the chips when mating them may be used. Alternatively or additionally, reflowed solder connections (e.g., C4) may be used to connect the substrates and, based on the surface tension of the liquid solder, to provide self-alignment. Another technique involves etch pits on the bottom surface of top substrate 310-1 (for example, using front-to-back photolithgraphic alignment) and the top surface of bottom substrate 310-2. Then, the chips may be aligned using a ball-in-pit alignment technique as they come together to create the multi-elevation substrate. Note that active chips 110 (FIG. 1) and bridge chip 116 (FIG. 1) may also be aligned to each other using ball-in-pit alignment.

While the preceding discussion has described a processing technique for fabricating microsprings using planar processing on two substrates and then mating those substrates, in other embodiments the multi-elevation substrate may be fabricated without simultaneous multi-layer processing. In some embodiments, an epitaxial liftoff process is used (for example, with a silicon-on-insulator substrate and an etch along a cleavage plane). Epitaxial processes can transfer thick (and possibly) tensioned layers of semiconductor or metal. Such techniques generally involve releasing these layers from a host substrate on which they are originally formed. Then, the released layers are transferred to a target substrate. Moreover, if needed, contacts to the epitaxial-layers may be post processed on the target substrate. In these embodiments, the microsprings are processed before release on a separate substrate. Then, using epitaxial liftoff, the tensioned epitaxial-layers are transferred onto the valleys and/or the mesas of the target substrate.

Figure 8:
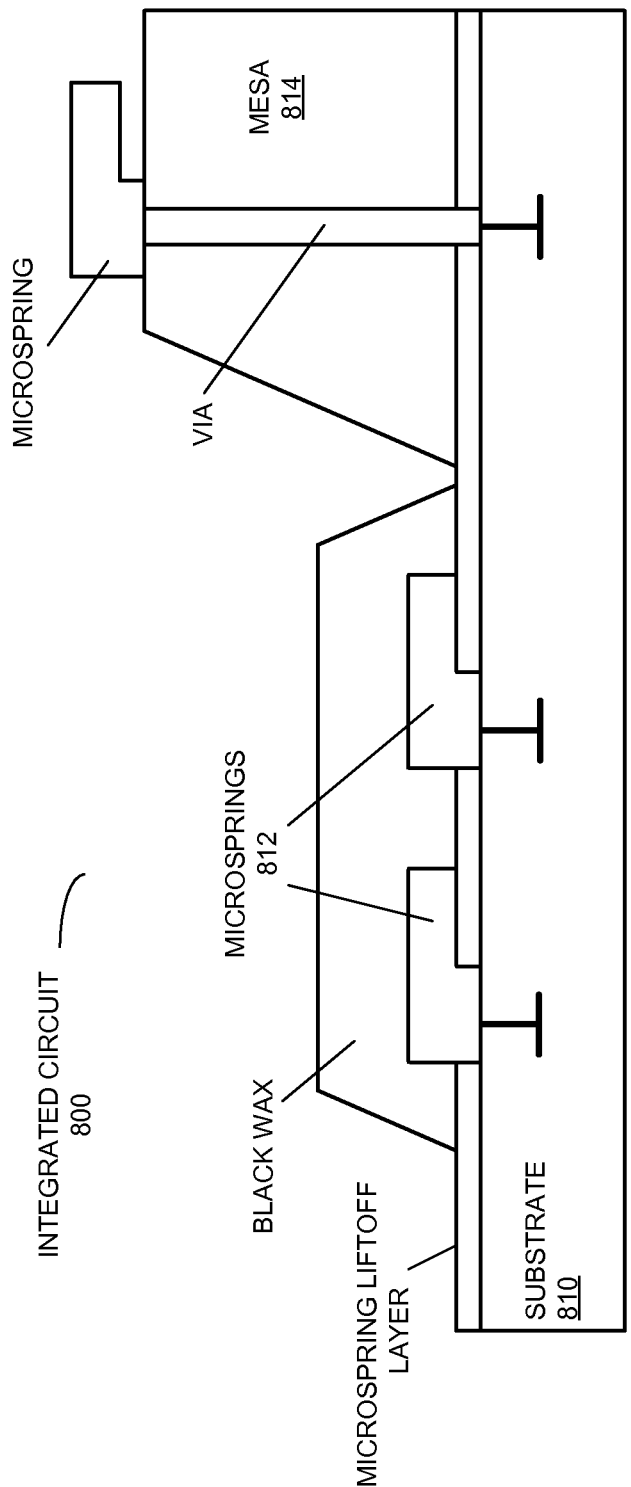
FIG. 8 is a block diagram illustrating an integrated circuit that includes microsprings in accordance with an embodiment of the present disclosure.

Another embodiment uses a mesa build-up process. This is shown in FIG. 8, which presents a block diagram illustrating an integrated circuit 800 that includes microsprings. In the mesa build-up process, the microspring layers (without releasing the microsprings 812) are deposited on a target planar substrate 810. These regions are intended to be the valleys in the final chip. Then, these regions are protected, for example, using photoresist and/or black wax. Moreover, mesas 814 may be built-up using a material such as polyimide. In some embodiments, mesas 814 are polished, for example, using CMP.

Subsequently, in order to protect the mesas, photoresist may be spun on again. Furthermore, the black wax (or other material used to protect the valleys) may be removed, and the microsprings may be released. This processing technique may enable the fabrication of multi-elevation microsprings on a single substrate 810.

We now describe embodiments of a computer system that includes one or more integrated circuits, such as integrated circuit 610 (FIGS. 6A-6C) and/or integrated circuit 800 (FIG.

Figure 9:
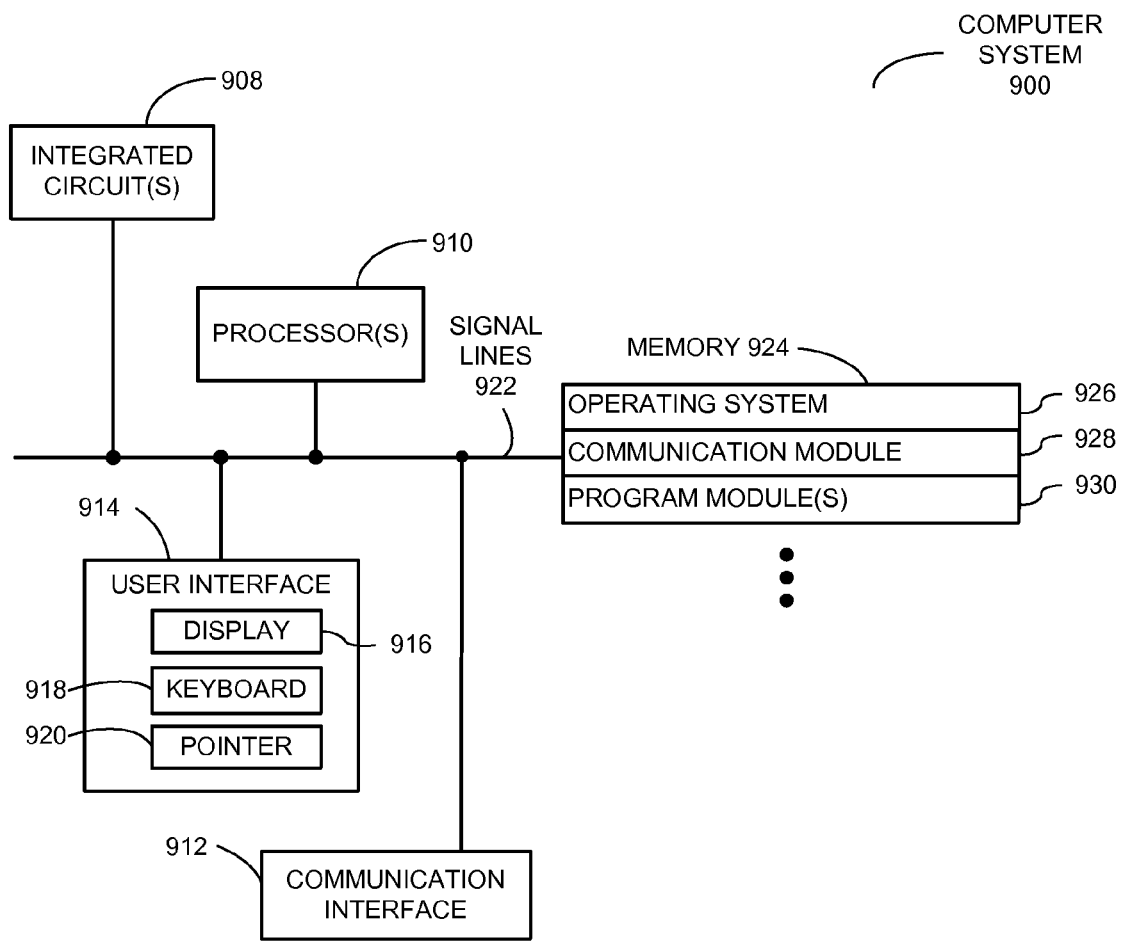
FIG. 9 is a block diagram illustrating a computer system that includes an integrated circuit with microsprings in accordance with an embodiment of the present disclosure.

8). FIG. 9 presents a block diagram illustrating a computer system 900 that includes an integrated circuit 908 with microsprings. Computer system 900 includes: one or more processors (or processor cores) 910, a communication interface 912, a user interface 914, and one or more signal lines 922 coupling these components together. Note that the one or more processors (or processor cores) 910 may support parallel processing and/or multi-threaded operation, the communication interface 912 may have a persistent communication connection, and the one or more signal lines 922 may constitute a communication bus. Moreover, the user interface 914 may include: a display 916, a keyboard 918, and/or a pointer 920, such as a mouse.

Memory 924 in the device 900 may include volatile memory and/or non-volatile memory. More specifically, memory 924 may include: ROM, RAM, EPROM, EEPROM, flash, one or more smart cards, one or more magnetic disc storage devices, and/or one or more optical storage devices. Memory 924 may store an operating system 926 that includes procedures (or a set of instructions) for handling various basic system services for performing hardware-dependent tasks. Moreover, memory 924 may also store communication procedures (or a set of instructions) in a communication module 928. These communication procedures may be used for communicating with one or more computers, devices and/or servers, including computers, devices and/or servers that are remotely located with respect to the device 900.

Memory 924 may also include one or more program modules 930 (or a set of instructions). Note that one or more of program modules 930 may constitute a computer-program mechanism. Instructions in the various modules in the memory 924 may be implemented in: a high-level procedural language, an object-oriented programming language, and/or in an assembly or machine language. The programming language may be compiled or interpreted, i.e., configurable or configured, to be executed by the one or more processors (or processor cores) 910.

Note that the one or more integrated circuits 908 (which include microsprings at different vertical positions relative to a substrate) may be included in a multi-chip module (MCM) (such as a switch or a processor). This MCM may include an array of chip modules (CMs) or single-chip modules (SCMs), and a given SCM may include at least one semiconductor die. Note that the MCM is sometimes referred to as a 'macro-chip.' Furthermore, the semiconductor die may communicate with other semiconductor dies, CMs, SCMs, and/or devices in the MCM using PxC of electromagnetically coupled signals (which is referred to as 'electromagnetic PxC'), such as capacitively coupled signals and/or PxC of optical signals (which are, respectively, referred to as 'electrical PxC' and 'optical PxC'). In some embodiments, the electromagnetic PxC includes inductively coupled signals and/or conductively coupled signals.

Computer system 900 may include, but is not limited to: a server, a laptop computer, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. For example, integrated circuit(s) 908 may be included in a backplane that is coupled to multiple processor blades, or integrated circuit(s) 908 may couple different types of components (such as processors, memory, I/O devices, and/or peripheral devices). Thus, integrated circuit(s) 908 may perform the functions of: a switch, a hub, a bridge, and/or a router. Note that computer system 900 may be at one location or may be distributed over multiple, geographically dispersed locations.

Substrate 310-1 (FIGS. 3-5B), substrate 310-2 (FIGS. 5A and 5B), integrated circuit 610 (FIGS. 6A-6C), integrated circuit 800 (FIG. 8) and/or computer system 900 may include fewer components or additional components. For example, microsprings can have a variety of different shapes, such as: rectangles, circles and/or fingers. Furthermore, there may be two or more microspring geometries on a given chip. Thus, data-signal microsprings may be short with blunt ends, while power-signal microsprings may be longer with sharper tips. In addition, as known to one of skill in the art, a wide variety of manufacturing tools and techniques may be used to fabricate integrated circuit 610 (FIGS. 6A-6C) and integrated circuit 800 (FIG. 8), including: sputtering, evaporation, isotropic etching, anisotropic etching, lift-off techniques, photolithography, and/or mask-less lithography.

Moreover, although these components and systems are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. Note that some or all of the functionality of the computer system 900 may be implemented in one or more application-specific integrated circuits (ASICs) and/or one or more digital signal processors (DSPs). Furthermore, functionality in integrated circuit 610 (FIGS. 6A-6C), integrated circuit 800 (FIG. 8) and/or computer system 900 may be implemented more in hardware and less in software, or less in hardware and more in software, as is known in the art.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. An integrated circuit, comprising:
    a first substrate that includes a first surface with lithographically defined microsprings and a second surface on an opposite side of the first substrate from the first surface; and
    a second substrate having a third surface, which is rigidly mechanically coupled to the second surface of the first substrate, wherein the third surface includes lithographically defined microsprings,
    wherein the first surface is at a different vertical position than the third surface in the integrated circuit;
    wherein the first substrate includes a hole, defined at least in part by an edge, which extends from the first surface to the second surface; and
    wherein the microsprings on the third surface are within a region defined by the edge, and wherein each of the microsprings on the third surface is entirely below the first surface.

2. The integrated circuit of claim 1, wherein the first substrate is rigidly mechanically coupled to the second substrate by lamination.

3. The integrated circuit of claim 2, wherein the lamination includes glue, solder, silicon-water fusion or copper-to-copper fusion.

4. The integrated circuit of claim 1, wherein the first substrate includes silicon or silicon-on-insulator; and
wherein the second substrate includes silicon or silicon-on-insulator.

5. The integrated circuit of claim 1, wherein the difference in the vertical positions of the first surface and the third surface is greater than a depth of focus in a lithographic process used to fabricate the microsprings on the first surface and the third surface.

6. The integrated circuit of claim 1, wherein a thickness of the first substrate is greater than 5 μm.

7. A computer system comprising an integrated circuit, wherein the integrated circuit includes:
a processor;
a memory configured to store instructions to be executed by the processor; and
a first substrate that includes a first surface with lithographically defined microsprings and a second surface on an opposite side of the first substrate from the first surface; and
a second substrate having a third surface, which is rigidly mechanically coupled to the second surface of the first substrate, wherein the third surface includes lithographically defined microsprings;
wherein the first surface is at a different vertical position than the third surface in the integrated circuit;
wherein the first substrate includes a hole, defined at least in part by an edge, which extends from the first surface to the second surface; and
wherein the microsprings on the third surface are within a region defined by the edge, and wherein each of the microsprings on the third surface is entirely below the first surface.

8. The computer system of claim 7, wherein the first substrate is rigidly mechanically coupled to the second substrate by lamination.

9. The computer system of claim 8, wherein the lamination includes glue, solder, silicon-water fusion or copper-to-copper fusion.

10. The computer system of claim 7, wherein the first substrate includes silicon or silicon-on-insulator; and
wherein the second substrate includes silicon or silicon-on-insulator.

11. The computer system of claim 7, wherein the difference in the vertical positions of the first surface and the third surface is greater than a depth of focus in a lithographic process used to fabricate the microsprings on the first surface and the third surface.

* * * * *